(12) United States Patent
Ballard

(10) Patent No.: US 10,824,385 B2
(45) Date of Patent: Nov. 3, 2020

(54) AUTOMATED AUDIO VOLUME STABILIZER

(71) Applicant: CHARTER COMMUNICATIONS OPERATING, LLC, St. Louis, MO (US)

(72) Inventor: Justin Earl Ballard, Pasadena, CA (US)

(73) Assignee: CHARTER COMMUNICATIONS OPERATING, LLC, St. Louis, MO (US)

( * ) Notice: Subject to any disclaimer, the term of this patent is extended or adjusted under 35 U.S.C. 154(b) by 444 days.

(21) Appl. No.: 14/633,232

(22) Filed: Feb. 27, 2015

(65) Prior Publication Data

US 2016/0254795 A1 Sep. 1, 2016

(51) Int. Cl.
| | | |
|---|---|---|
| *H03G 3/00* | (2006.01) | |
| *G06F 3/16* | (2006.01) | |
| *H04N 21/439* | (2011.01) | |
| *H04N 21/436* | (2011.01) | |
| *H03G 7/00* | (2006.01) | |
| *H03G 3/04* | (2006.01) | |
| *H04N 21/485* | (2011.01) | |

(52) U.S. Cl.
CPC .............. *G06F 3/165* (2013.01); *H03G 3/04* (2013.01); *H03G 7/002* (2013.01); *H04N 21/4394* (2013.01); *H04N 21/4398* (2013.01); *H04N 21/43615* (2013.01); *H04N 21/4392* (2013.01); *H04N 21/4852* (2013.01)

(58) Field of Classification Search
CPC .......................... H04N 21/4392; G06F 3/165
USPC ................................................. 381/104, 107
See application file for complete search history.

(56) References Cited

U.S. PATENT DOCUMENTS

| | | | | |
|---|---|---|---|---|
| 5,130,665 A | * | 7/1992 | Walden | H03G 3/04 330/129 |
| 2007/0223739 A1 | * | 9/2007 | Na | G06F 1/1688 381/112 |
| 2009/0103752 A1 | * | 4/2009 | Chou | H04R 25/70 381/107 |
| 2013/0272543 A1 | * | 10/2013 | Tracey | H03G 3/32 381/107 |

* cited by examiner

*Primary Examiner* — Katherine A Faley
(74) *Attorney, Agent, or Firm* — Meagher Emanuel Laks Goldberg & Liao, LLP

(57) ABSTRACT

The specification and drawings present a new method, apparatus and software related product (e.g., a computer readable memory or a storage device) for automatically stabilizing a volume of different audio streams/contents to predefined boundary levels which may be requested by a user. According to an embodiment, an automated volume control feature may allow a user to set the highest level of volume for any audio stream played on a user's device for automatically adjusting the incoming audio content volume of audio streams not to exceed at least the highest level of volume set as the maximum threshold volume.

20 Claims, 7 Drawing Sheets

AUTOMATED AUDIO VOLUME STABILIZER

FIELD OF THE INVENTION

The invention relates to audio volume control and, more particularly but not exclusively, automatically stabilizing a volume of different audio streams/contents to predefined boundary levels which may be requested by a user.

BACKGROUND

In many practical situations, for example, when a user changes broadcasting channels on TV (television), the volume of broadcasting may significantly change which can create user's discomforting experience such as waking a baby sleeping in an adjacent room if the volume is too high, or not clearly hearing the audio content if the volume is too low.

Normally to deal with this situation, the user may hold a remote control with finger on the volume button, constantly going up and down on the volume to reach the hearing threshold for hearing the audio content by increasing the volume of the sound and/or constantly adjusting to reduce the volume for avoiding the spikes in volume of a particular audio stream. If someone tries wearing a headset then hearing the baby in the adjacent room may be difficult.

SUMMARY

Various deficiencies in the prior art are addressed by using a method, apparatus and software related product according to embodiments disclosed herein.

According to a first aspect of the invention, a method (performed by an electronic device) comprising: setting minimum and maximum threshold volumes defining respective minimum and maximum acceptable volumes for audio signals; buffering an audio signal for a predefined time interval from an audio stream; determining whether the buffered audio signal has volume peaks exceeding the maximum threshold volume and has volume valleys falling below the minimum threshold volume; calculating a volume adjustment for the buffered audio signal using a predefined algorithm for modifying a volume corresponding to the buffered audio signal, so that by applying the calculated volume adjustment, the volume corresponding to the buffered audio signal including the determined one or more of volume peaks and valleys is limited by the maximum and minimum threshold volumes during the predefined time interval; and providing the buffered audio signal modified according to the calculated volume adjustment to a play-out device for playing out the audio stream.

According to a second aspect of the invention, an apparatus comprising: a processor; a storage medium for tangibly storing thereon program logic for execution by the processor, the program logic comprising: logic to set minimum and maximum threshold volumes defining respective minimum and maximum acceptable volumes for audio signals; logic to buffer an audio signal for a predefined time interval from an audio stream; logic to determine whether the buffered audio signal has volume peaks exceeding the maximum threshold volume and has volume valleys falling below the minimum threshold volume; logic to calculate a volume adjustment for the buffered audio signal using a predefined algorithm for modifying a volume corresponding to the buffered audio signal, so that by applying the calculated volume adjustment, the volume corresponding to the buffered audio signal including the determined one or more of volume peaks and valleys is limited by the maximum and minimum threshold volumes during the predefined time interval; and logic to provide the buffered audio signal modified according to the calculated volume adjustment to a play-out device for playing out the audio stream.

According to a third aspect of the invention, anon-transitory computer readable storage medium tangibly storing computer program instructions capable of being executed by a computer processor, the computer program instructions defining code for: setting minimum and maximum threshold volumes defining respective minimum and maximum acceptable volumes for audio signals; buffering an audio signal for a predefined time interval from an audio stream; determining whether the buffered audio signal has volume peaks exceeding the maximum threshold volume and has volume valleys falling below the minimum threshold volume; calculating a volume adjustment for the buffered audio signal using a predefined algorithm for modifying a volume corresponding to the buffered audio signal, so that by applying the calculated volume adjustment, the volume corresponding to the buffered audio signal including the determined one or more of volume peaks and valleys is limited by the maximum and minimum threshold volumes during the predefined time interval; and providing the buffered audio signal modified according to the calculated volume adjustment to a play-out device for playing out the audio stream.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

A method, apparatus and software related product (e.g., a computer readable memory or a storage device) are presented for automatically stabilizing a volume of different audio streams/contents to predefined boundary levels which may be requested by a user.

According to one embodiment an automated volume control feature may allow a user to set the highest level of volume (maximum threshold volume) for any audio stream played on a user's device (play-out device), for automatically adjusting the incoming audio content volume of audio streams not to exceed at least the highest level of volume set as the maximum threshold volume. The play-out device may be a television, a computer, a smart phone, tablet device and the like.

In addition, a lowest level of volume (minimum threshold volume) for any audio stream played on a user's device (play-out device) can be set by the user as well, or alternatively set as a system default parameter, for automatically adjusting the incoming audio content volume of audio streams not to fall below at least the lowest level of volume set as the minimum threshold volume.

Thus using both, the highest level of volume (maximum threshold volume) and the lowest level of volume (minimum threshold volume) as described herein, may allow to automatically maintain the volume of the played audio content for any incoming audio streams volume between the maximum and minimum threshold volumes, i.e. in a desired dynamic range.

It is noted that the methodologies, described herein, involve signal processing in time domain. For the purposes of this invention it is assumed that the electronic devices which can be used for implementing various embodiment described herein, have a fast electronic responses (i.e., having a fast impulse response time), so that transient effects (e.g., causing non-linear oscillations) in case of fast changing electric signals are negligible.

According to an embodiment, an electronic (computing) device can set minimum and maximum threshold volumes defining respective minimum and maximum acceptable volumes of for audio stream signals. The minimum and maximum threshold volumes may be set based on a user input through a user interface of the electronic/computing device or of a play-out device (if the play-out device is separate from the electronic/computing device. Alternatively, the minimum threshold volume may be set a system parameter (e.g., a default parameter) and the user can only provide the user's input corresponding to the maximum threshold volume.

Figure 1:
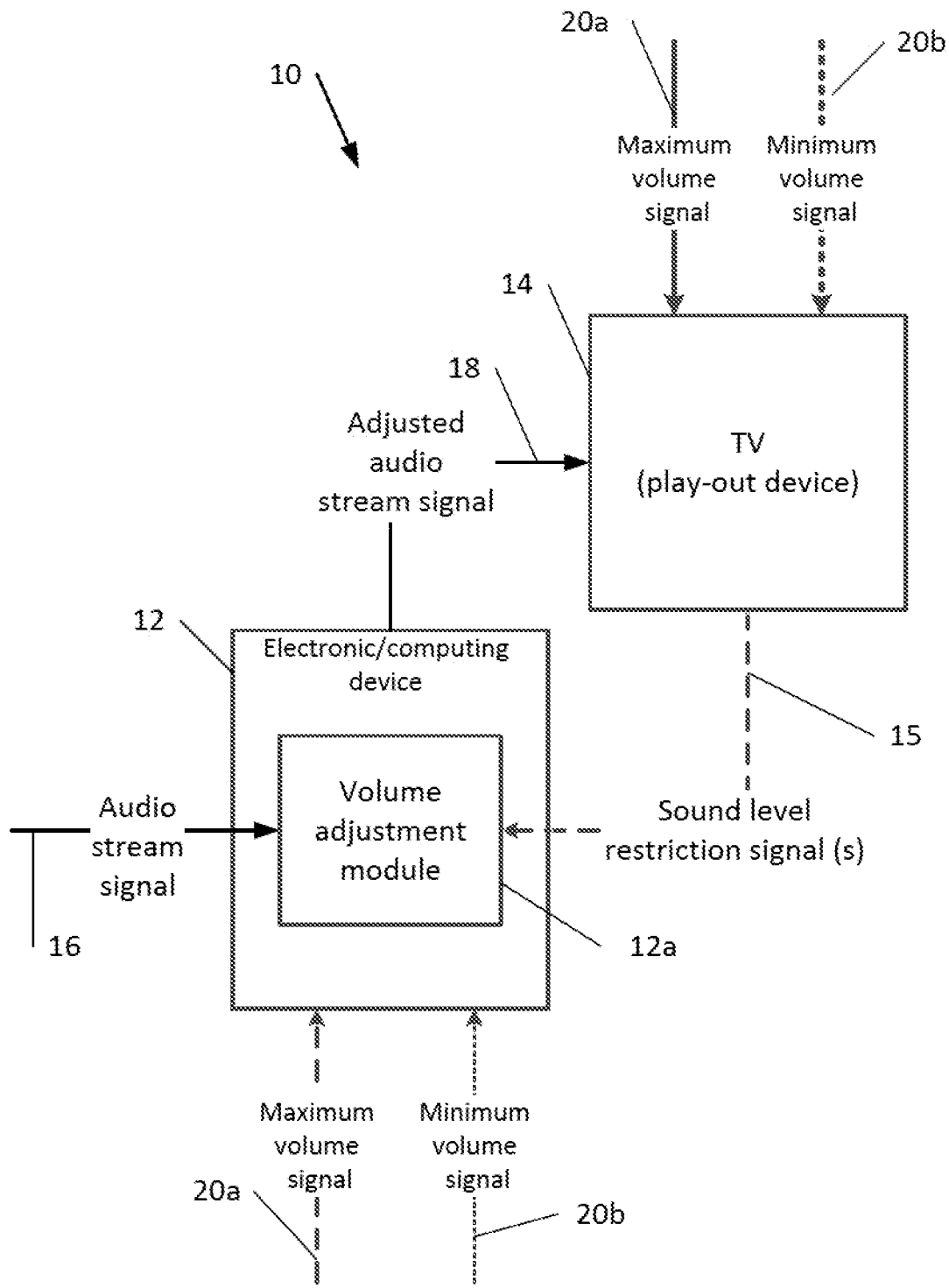
FIG. 1 is an exemplary block system diagram for practicing various embodiments.

It is noted that the electronic (computing) device may be a separate device/unit as shown in FIG. 1 as further described herein. Alternatively, the electronic/computing device may be one unit with the play-out device. In another embodiment the electronic (computing) device may be a part of a set-top box (STB).

When an audio stream (intended for a play-out device) reaches the electronic (computing) device, the device can buffer an audio signal for a predefined time interval from the incoming audio stream. The predefined time interval can be on the order of a few seconds (or the like) or sub-seconds considering evolving technologies. For example, the predefined time interval can be typically one to three seconds. Then the electronic (computing) device can determine whether the buffered audio signal has volume peaks exceeding the maximum threshold volume and has volume valleys falling below the minimum threshold volume. Following that determination (e.g., one or more of volume peaks and valleys being identified), the electronic (computing) device may calculate a volume adjustment for the buffered audio signal using a predefined algorithm (as further described herein, see FIGS. 2-5) for modifying a volume corresponding to the buffered audio signal. Applying the calculated volume adjustment can stabilize the volume corresponding to the buffered audio signal including the determined one or more of volume peaks and valleys to be between the maximum and minimum threshold volumes during the predefined time interval.

Following the volume adjustment calculations, the electronic (computing) device can provide the buffered audio signal modified according to the calculated volume adjustment to a play-out device such as a TV set for playing out the audio stream.

It is noted that buffering and processing as described above may create a small delay (few seconds) for delivering the buffered audio content/stream to the destination (play-out device). It should be further appreciated that any audio stream to which the embodiments described herein may be applied can be a part of a video stream. Then the adjusted audio stream has to be synchronized with a corresponding video signal in the electronic device or in a play-out device, as known to a person skilled in the art.

Volume adjustment for audio streams as described herein may be performed using different linear and non-linear methods. One of the methodologies described herein may use a linear adjustment of the volume using a predefined unit scale for the volume (audio volume).

In one example (see FIGS. 2a and 2b), the volume adjustment may comprise attenuating the determined volume peaks exceeding the maximum threshold volume to fall below the maximum threshold volume when no volume valleys being determined (loud signal), and the calculating may comprise:
  a) calculating a downscale volume coefficient as a ratio of a volume distance between the maximum and minimum threshold volumes and a further volume distance between the largest volume peak among the determined volume peaks and the minimum threshold volume; and
  b) multiplying the volume corresponding to the buffered audio signal in the predefined time interval by the calculated downscale volume coefficient to bring the determined volume peaks below the maximum threshold volume, the volume of the buffered audio signal being measured from the minimum threshold volume.

In another example (see FIGS. 3a and 3b), the volume adjustment may comprise amplifying the determined volume valleys falling below the minimum threshold volume to rise above the minimum threshold volume when no volume peaks being determined (quiet signal), and the calculating may comprise:
  a) calculating an up-scale volume coefficient as a ratio of a volume distance between the maximum and minimum threshold volumes and a further volume distance between the largest volume valley among the determined volume valleys and the maximum threshold volume; and
  b) multiplying the volume corresponding to the buffered audio signal in the predefined time interval by the calculated up-scale volume coefficient to bring the determined volume valleys above the minimum threshold volume, the volume of the buffered audio signal being measured from the maximum threshold volume.

When both the volume peaks and valleys are determined (identified), at least two different processing sequences may be used as demonstrated in FIGS. 4a-4c and 5a-5c.

According to one processing sequence (shown in FIGS. 4a-4c), the volume adjustment may comprise, firstly, attenuating the determined volume peaks exceeding the maximum threshold volume to fall below the maximum threshold volume, and, secondly, amplifying the resultant volume valleys falling below the minimum threshold volume to rise above the minimum threshold volume, and the calculating may comprise:
  a) calculating a downscale volume coefficient as a ratio of a volume distance between the maximum threshold volume and a largest volume valley among the determined volume valleys, and a further volume distance between a largest volume peak among the determined volume peaks and the largest volume valley;

b) multiplying the volume corresponding to the buffered audio signal measured from the largest volume valley by the calculated downscale volume coefficient to bring the determined volume peaks below the maximum threshold volume, the volume of the buffered audio signal being measured from the largest volume valley;

c) further calculating an up-scale volume coefficient as a ratio of a volume distance between the maximum and minimum threshold volumes and a further volume distance between the largest volume valley and the maximum threshold volume; and d) multiplying the volume corresponding to the down-scaled buffered audio signal in b) above in the predefined time interval by the up-scale volume coefficient, further calculated in c), to bring the resultant volume valleys (calculated in b)) above the minimum threshold volume, the volume of the downscaled buffered audio signal being measured from the maximum threshold volume.

According to another processing sequence (see FIGS. 5a-5c), the volume adjustment may comprise, first, amplifying the determined volume valleys falling below the minimum threshold volume to rise above the minimum threshold volume, and, second, attenuating the resultant volume peaks exceeding the maximum threshold volume to fall below the maximum threshold volume, and the calculating may comprise:

a) calculating an up-scale volume coefficient as a ratio of a volume distance between the minimum threshold volume and the largest volume peak among the determined volume peaks, and a further volume distance between a largest volume valley among the determined volume valleys and the largest volume peak;

b) multiplying the volume corresponding to the buffered audio signal in the predefined time interval measured from the maximum value peak by the calculated up-scale volume coefficient to bring the determined volume valleys above the minimum threshold volume, the volume of the buffered audio signal being measured from the largest volume peak;

c) further calculating a downscale volume coefficient as a ratio of a volume distance between the maximum and minimum threshold volumes and a further volume distance between the largest volume peak and the minimum threshold volume; and d) multiplying the volume corresponding to the up-scaled buffered audio signal in b) in the predefined time interval by the downscale volume coefficient further calculated in c) to bring the resultant volume peaks calculated in b) below the maximum threshold volume, the volume of the up-scaled buffered audio signal being measured from the minimum threshold volume.

The various embodiments described herein may be used in many practical situations to improve user's experience. One example would be to improve the user's experience with keeping a baby asleep and to be able to hear when the baby needs attention. Moreover, the methodology described herein may help a user watching television to relax, have fun and not to worry about waking a sleeping spouse, the baby, your neighbors or even the user's own annoyance with sound spikes. This feature will eliminate the need for the manual adjustments of volume and can help the user truly relax without worrying about this issue.

FIGS. 1, 2a-2b, 3a-3b, 4a-4c, 5a-5c, 6 and 7 provide illustrations of implementing different embodiments described herein.

FIG. 1 shows an exemplary block diagram of a system 10 for practicing various embodiments. An electronic/computing device 12 is shown as a separate device which can be a stand-alone unit, a part of the STB (set-top device) or a part of a play-out device 14 (e.g., a television).

The device 12 sets can set maximum acceptable volumes of a corresponding audio stream signal 16. The minimum and maximum threshold volumes are set based on a user input including a maximum volume signal 20a and optionally a minimum volume signal 20b through a user interface of the electronic device 12 or of a play-out device 14 (if the play-out device 14 is separate from the device 12). If the user input is entered through the play-out device 14, a sound level restriction signal 15 indicative of the signal 20a and the optional signal 20b is provided to the device 12. Alternatively, the minimum threshold volume may be set as a system parameter such as a default parameter, and the user can only provide the user' input corresponding to the maximum threshold volume (i.e., using only signal 20a).

A volume adjustment module 12a performs steps described herein (also see FIG. 6 for more details) for buffering the audio stream signal 16 in a memory of the device 12 (see FIG. 7) and performs other steps as described herein and shown in a flow chart of FIG. 6 including at least a) determining whether the buffered audio signal (of the signal 16) has volume peaks exceeding the maximum threshold volume and has volume valleys falling below the minimum threshold volume, b) calculating a volume adjustment for the buffered audio signal using a predefined algorithm for modifying a volume corresponding to the buffered audio signal, and c) providing the buffered audio signal 18 modified according to the calculated volume adjustment to a play-out device for playing out the audio stream.

The volume adjustment module 12a may be implemented as a software, a firmware and/or a hardware module or a combination thereof. In case of an analog signal 16, additional analog-to-digital converter (ADC) may be needed. In particular, in the case of software or firmware, one embodiment may be implemented using software related product such as a computer readable memory (e.g., non-transitory computer readable memory), a computer readable medium or a computer readable storage structure comprising computer readable instructions (e.g., program instructions) using a computer program code (i.e., the software or firmware) thereon to be executed by a processor.

FIGS. 2a-2b, 3a-3b, 4a-4c and 5a-5c show illustrative non-limiting examples of calculating the volume adjustment for the buffered audio signal using a predefined algorithm for modifying a volume corresponding to the buffered audio signal. It is noted that the audio signals shown in the aforementioned Figures are for a concept illustration only and are not depicting real audio signals. A vertical scale in all these Figures for the volume of the audio signal (which can have a logarithmic scale) uses arbitrary units (AU).

Figure 2A:
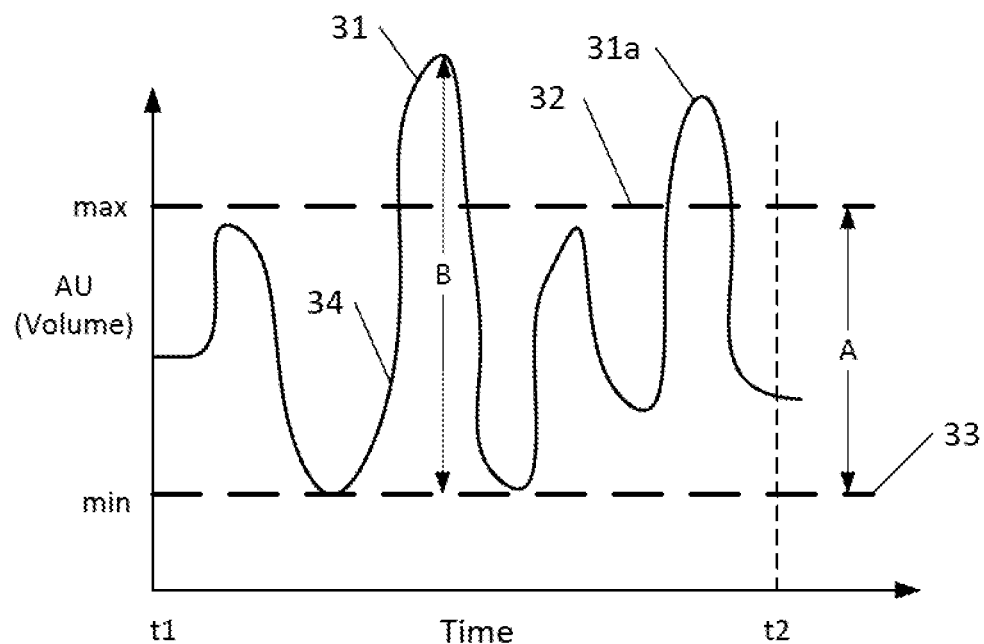
FIGS. 2a-2b, 3a-3b, 4a-4c and 5a-5c are illustrative non-limiting examples of graphs of dependencies of audio volume vs. time for calculating the volume adjustment for the buffered audio signal using a predefined algorithm for modifying a volume corresponding to the buffered audio signal, according to various embodiments.

FIG. 2a shows a graph of a volume (AU) of a buffered audio stream signal 34 as a function of time during the predetermined time interval t1-t2. Dotted lines 32 and 33 indicate corresponding maximum and minimum threshold volumes with a distance A in arbitrary units being a difference (or a desired dynamic range of the audio signal) between the threshold volumes 32 and 33. The signal 34 has determined (identified) volume peaks 31 and 31a exceeding the maximum threshold volume 32. The volume peak 31 is the largest volume peak with a distance B separating the peak 31 from the minimum threshold volume 33. A downscaling coefficient can be defined as a ratio of A/B.

Figure 2B:
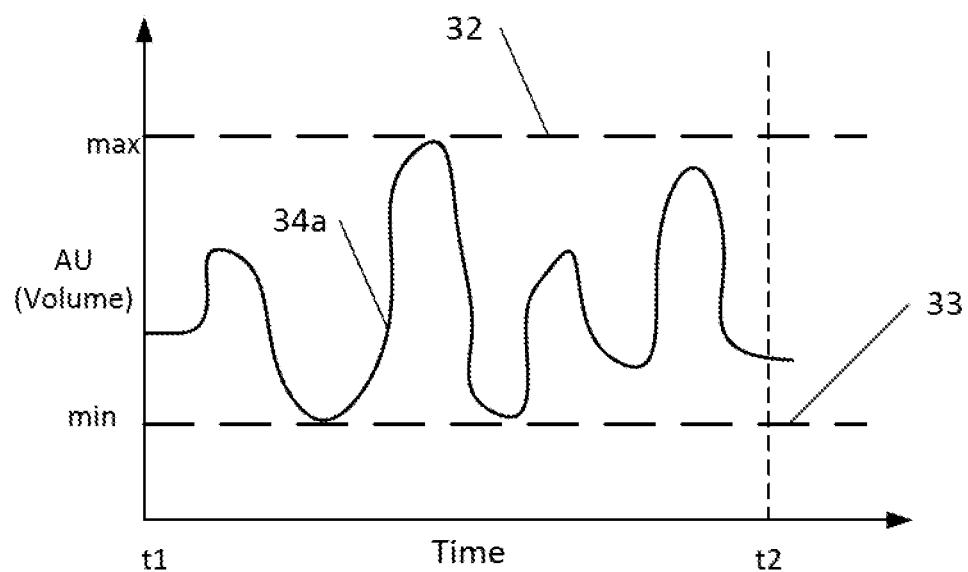

FIG. 2b has a similar arrangement as FIG. 2a but depicting a buffered audio signal 34a which is generated by multiplying the signal 34 of FIG. 2a measured from the minimum threshold volume 33 by the downscaling coefficient A/B. As shown in FIG. 2b, the resultant signal 34a is limited by the maximum and minimum threshold volumes 32 and 33, thus being in the desired dynamic range.

Figure 3A:
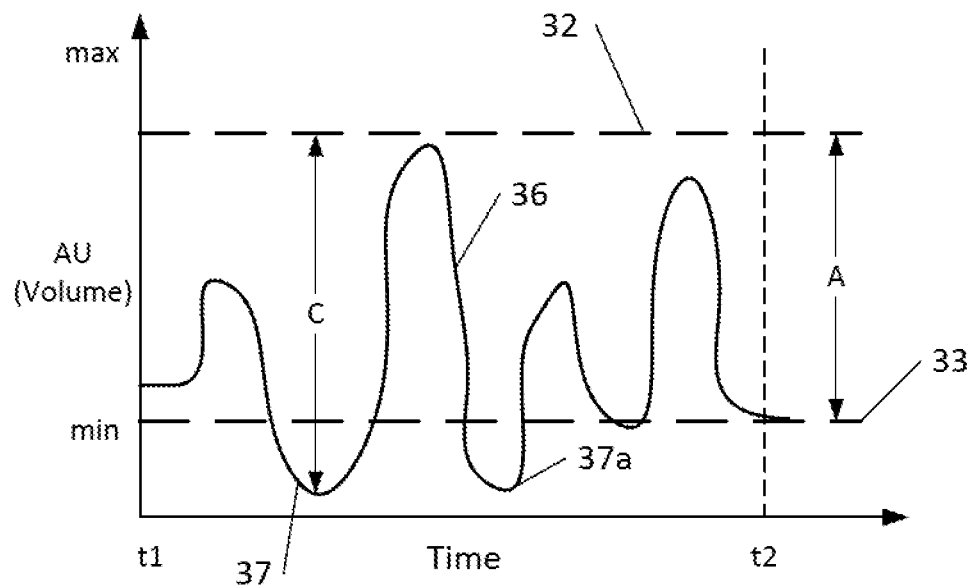

FIG. 3a shows a graph of a volume of a buffered audio stream signal 36 as a function of time during the predetermined time interval t1-t2. Dotted lines 32 and 33 indicate corresponding maximum and minimum threshold volumes with a distance A in arbitrary units being a difference (or a desired dynamic range of the audio signal) between the threshold volumes 32 and 33. The signal 36 has determined (identified) volume valleys 37 and 37a falling below the minimum threshold volume 33. The volume valley 37 is the largest volume valley with a distance C separating the valley 37 from the maximum threshold volume 33. An upscaling coefficient can be defined as a ratio of A/C.

Figure 3B:
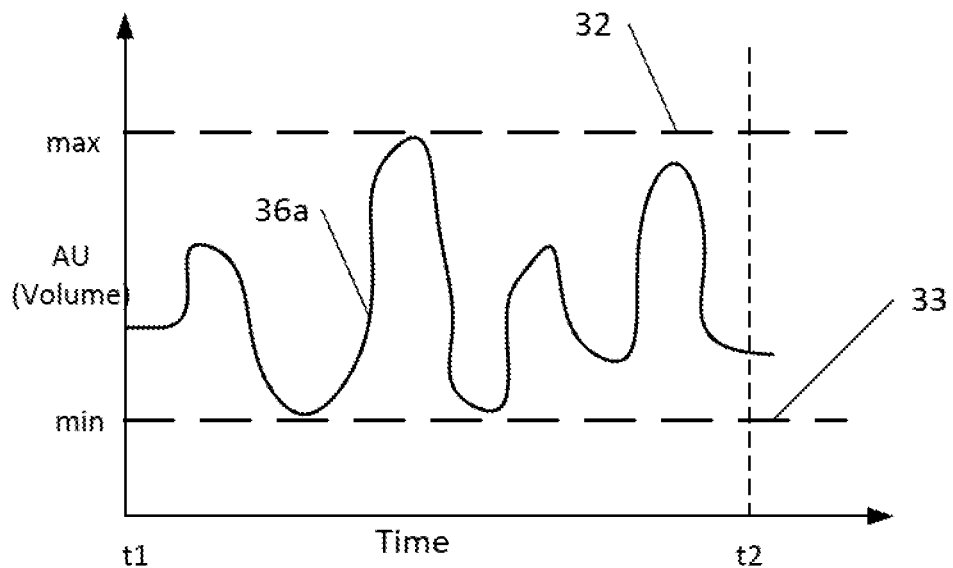

FIG. 3b has a similar arrangement as FIG. 3a but depicting a buffered audio signal 36a which is generated by multiplying the signal 36 of FIG. 3a measured from the maximum threshold volume 32 by the upscaling coefficient A/C. As shown in FIG. 3b, the resultant signal 36a is limited by the maximum and minimum threshold volumes 32 and 33, thus being in the desired dynamic range.

FIGS. 4a-4c and 5a-5c shows alternative steps for calculating the volume adjustment for the case when both the volume peaks and volume valleys are determined in the buffered audio stream signal during the predetermined time interval.

Figure 4A:
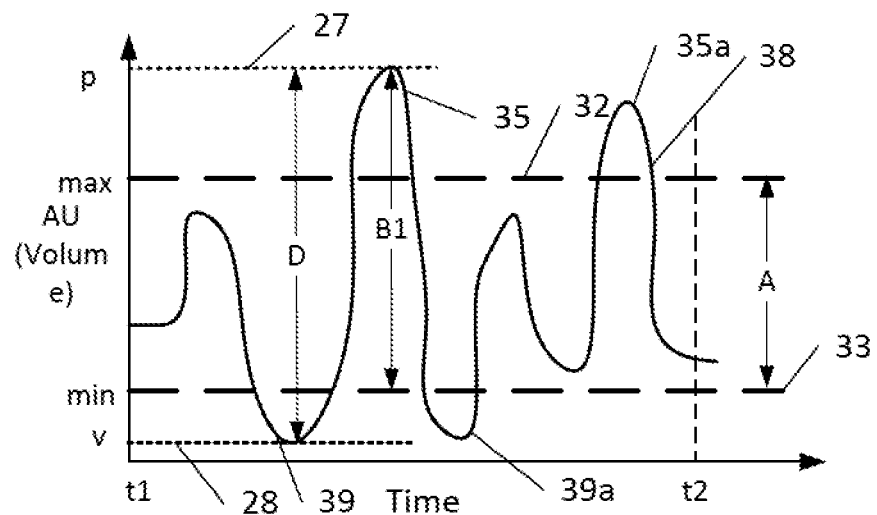

FIG. 4a shows a graph of a volume of a buffered audio stream signal 38 as a function of time during the predetermined time interval t1-t2. Dotted lines 32 and 33 indicate corresponding maximum and minimum threshold volumes with a distance A in arbitrary units being a difference (or a desired dynamic range of the audio signal) between the threshold volumes 32 and 33. The signal 38 has determined (identified) volume peaks 35 and 35a exceeding the maximum threshold volume 32 and volume valleys 39 and 39a falling below the minimum threshold volume 33. The volume peak 35 is the largest volume peak with a distance B1 separating the volume peak 35 from the minimum threshold volume 33.

Dotted lines 27 and 28 are indicative of corresponding maximum volume peak 35 and maximum volume valley 39 with a distance D in arbitrary units being a difference between them. A downscaling coefficient can be defined as a ratio of B1/D.

Figure 4B:
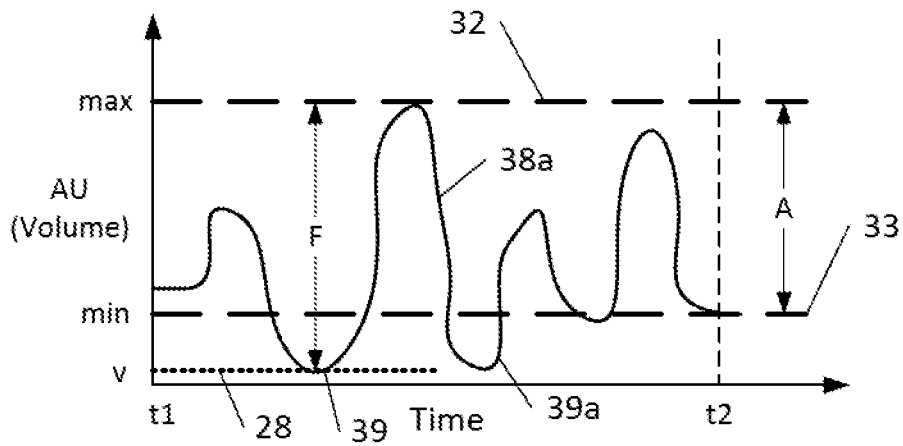

FIG. 4b has a similar arrangement as FIG. 4a but depicting a buffered audio signal 38a which is generated by multiplying the signal 38 of FIG. 4a measured from the line 28 by the downscaling coefficient B1/D. As shown in FIG. 4b, the resultant signal 38a still has the volume valleys 39 and 39a falling below the minimum threshold volume 33. The volume valley 39 is the largest volume valley with a distance F separating the valley 39 from the maximum threshold volume 32. An upscaling coefficient can be defined as a ratio of A/F.

Figure 4C:
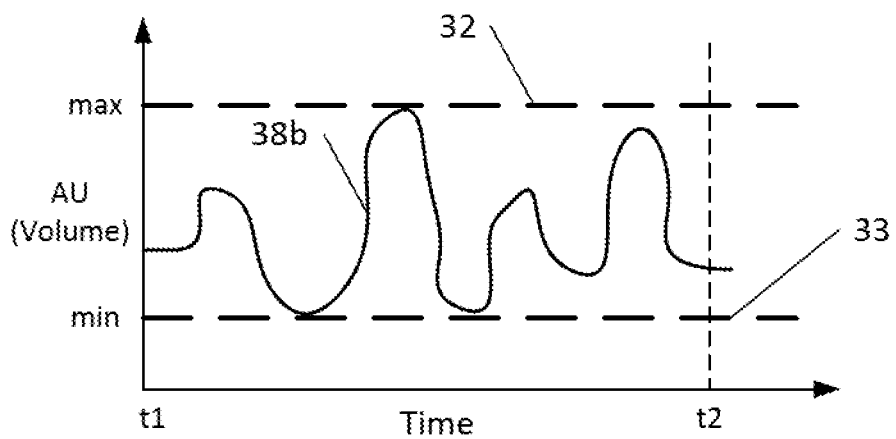

FIG. 4c has a similar arrangement as FIGS. 4a and 4b but depicting a buffered audio signal 38b which is generated by multiplying the signal 38a of FIG. 4b measured from the maximum threshold volume 32 by the upscaling coefficient A/F. As shown in FIG. 4c, the resultant signal 38b is limited by the maximum and minimum threshold volumes 32 and 33, thus being in the desired dynamic range.

Figure 5A:
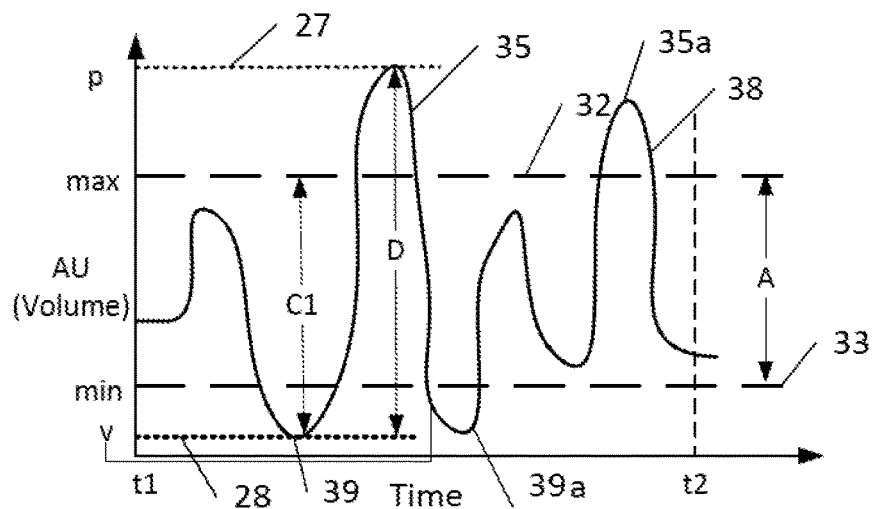

FIG. 5a shows a graph of a volume of a buffered audio stream signal 38 as a function of time during the predetermined time interval t1-t2 (similar to FIG. 4a). Dotted lines 32 and 33 indicate corresponding maximum and minimum threshold volumes with a distance A in arbitrary units being a difference (or a desired dynamic range of the audio signal) between the threshold volumes 32 and 33. The signal 38 has determined (identified) volume peaks 35 and 35a exceeding the maximum threshold volume 32 and volume valleys 39 and 39a falling below the minimum threshold volume 33. The volume valley 39 is the largest volume valley with a distance C1 separating the volume valley 39 from the maximum threshold volume 32.

Dotted lines 27 and 28 are indicative of corresponding maximum volume peak 35 and maximum volume valley 39 with a distance D in arbitrary units being a difference between them. An up-scaling coefficient can be defined as a ratio of C1/D.

Figure 5B:
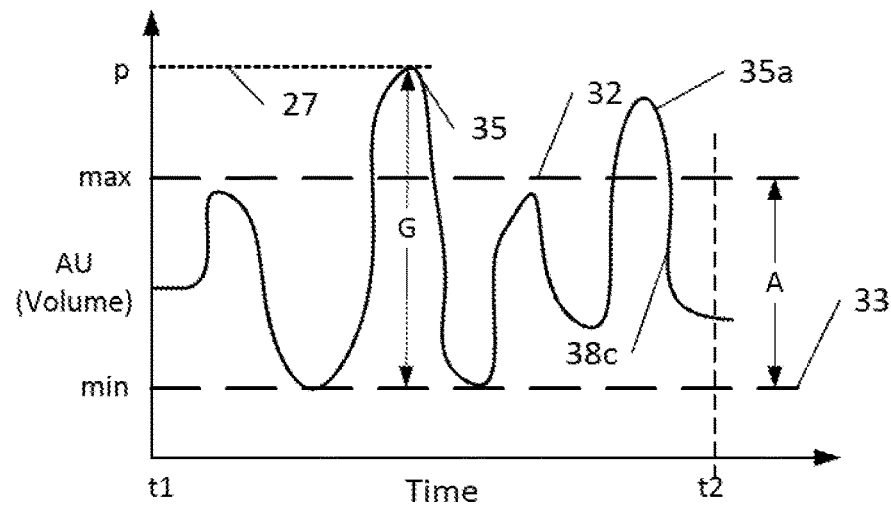

FIG. 5b has a similar arrangement as FIG. 5a but depicting a buffered audio signal 38c which is generated by multiplying the signal 38 of FIG. 5a measured from the line 27 by the upscaling coefficient C1/D. As shown in FIG. 5b, the resultant signal 38c still has the volume peaks 35 and 35a exceeding the maximum threshold volume 32. The volume peak 35 is the largest volume peak with a distance G separating the peak 35 from the minimum threshold volume 33. An upscaling coefficient can be defined as a ratio of A/G.

Figure 5C:
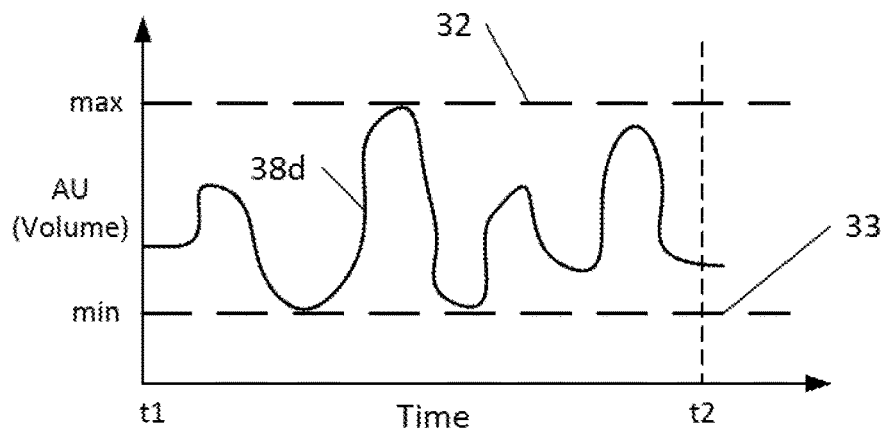

FIG. 5c has a similar arrangement as FIGS. 5a and 5b but depicting a buffered audio signal 38d which is generated by multiplying the signal 38c of FIG. 4b measured from the minimum threshold volume 33 by the upscaling coefficient A/G. As shown in FIG. 5c, the resultant signal 38d is limited by the maximum and minimum threshold volumes 32 and 33, thus being in the desired dynamic range.

Figure 6:
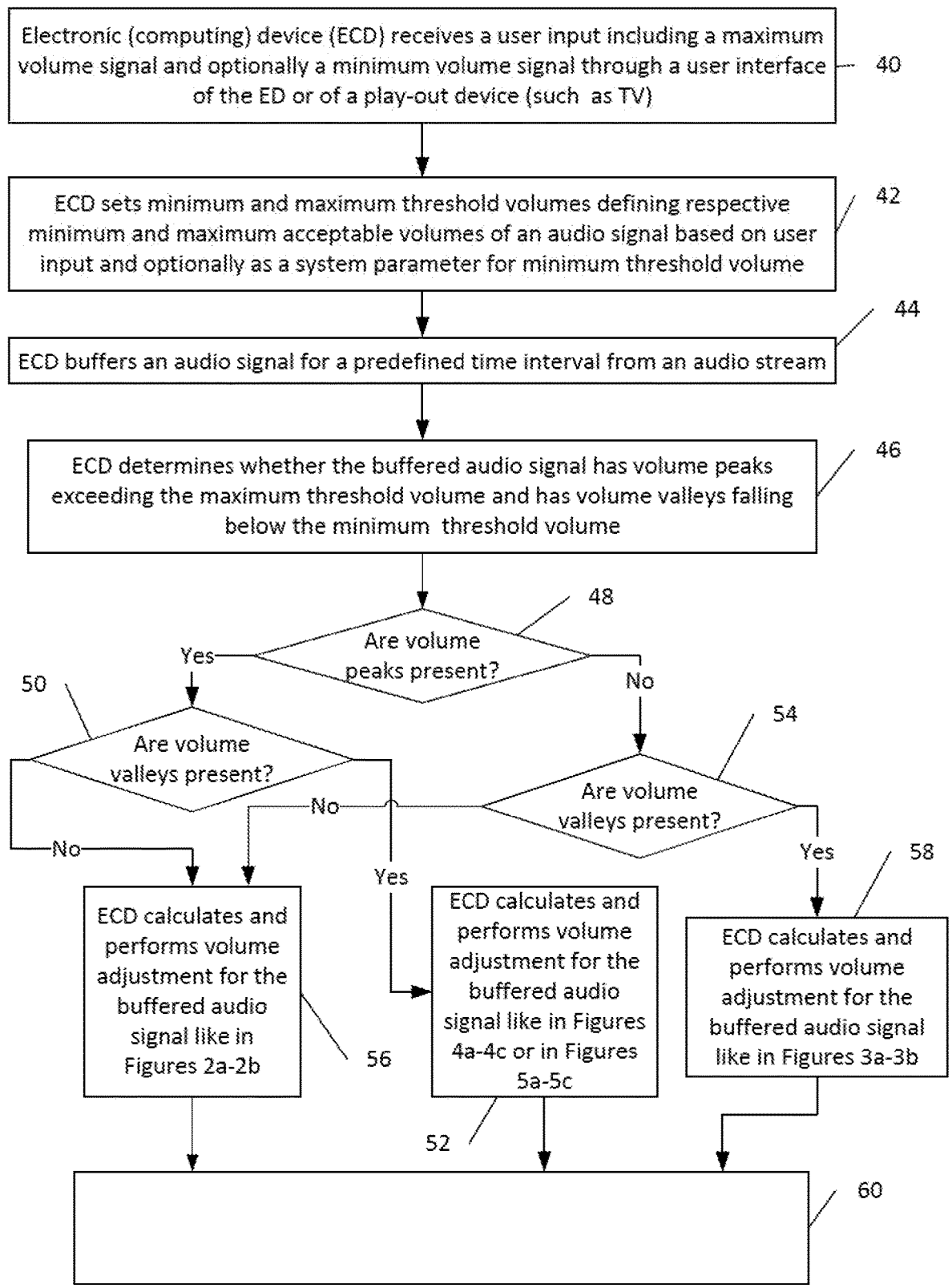
FIG. 6 is a flow chart of a method demonstrating implementation by an electronic computing device (ECD) of various embodiments described herein.

With reference now to FIG. 6, shown is an exemplary flow chart demonstrating implementation of the described embodiments by an electronic/computing device (e.g., the device 12 in FIG. 1 or the computing device 700 in FIG. 7), as described herein. It is noted that the order of steps shown in FIG. 6 is not required, so in principle, the various steps may be performed out of the illustrated order. Also certain steps may be skipped, different steps may be added or substituted, or selected steps or groups of steps may be performed in a separate application following the embodiments described herein.

Figure 7:
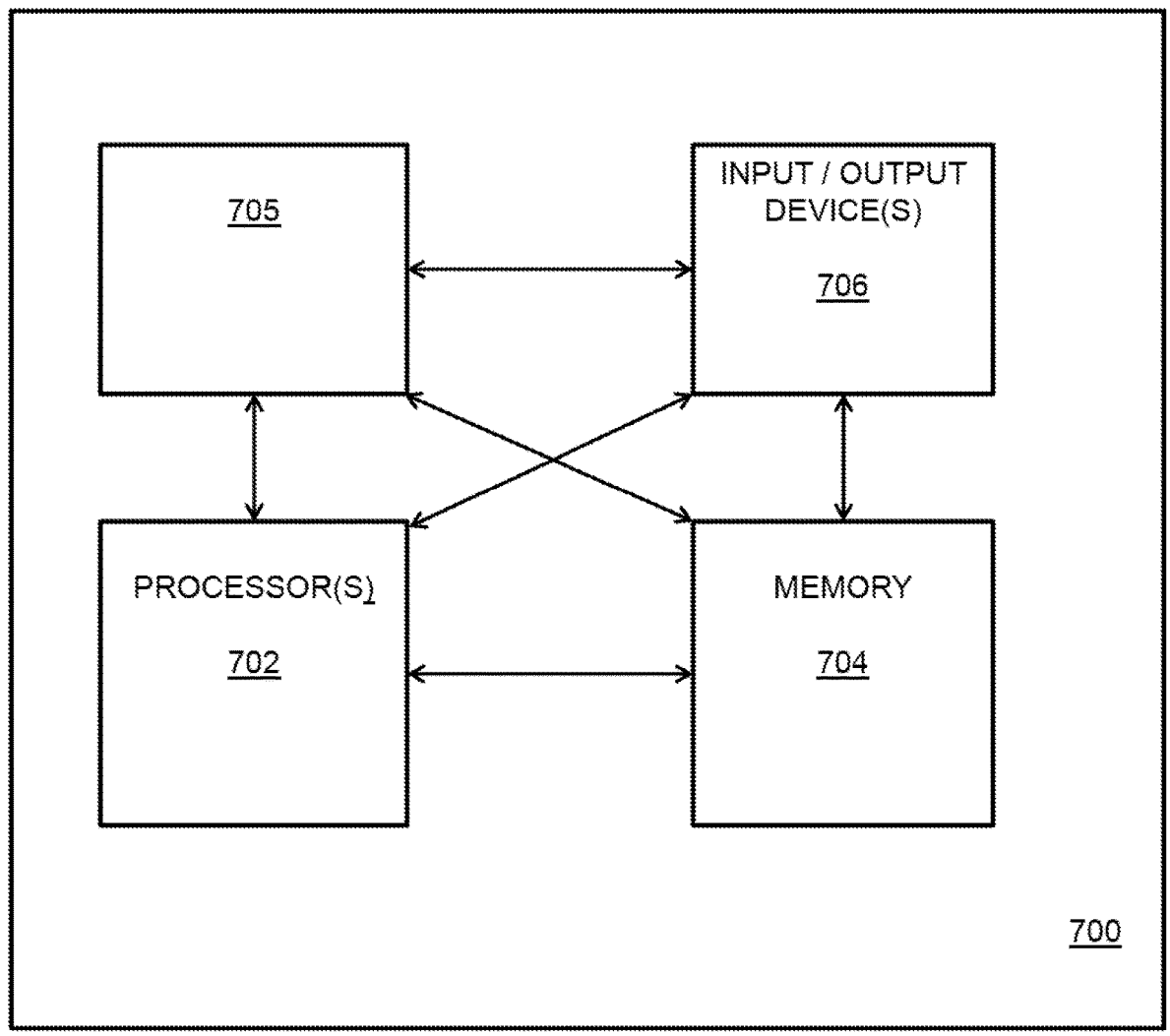
FIG. 7 is a high-level block diagram of an electronic device/computer suitable for performing various embodiments described herein.

In a method according to the embodiment shown in FIG. 6, in a first step 40, an electronic/computing device (ECD) such as the device 12 in FIG. 1 or the device 700 in FIG. 7, receives a user input including a maximum volume signal and optionally a minimum volume signal through a user interface of the ECD or of a play-out device (such as TV).

In a next step 42, the ECD sets minimum and maximum threshold volumes defining respective minimum and maximum acceptable volumes of an audio signal based on user input and optionally on a system parameter for the minimum threshold volume as described herein.

In a next step 44, the ECD buffers an audio signal for a predefined time interval from an audio stream.

In a next step 46, the ECD determines whether the buffered audio signal has volume peaks exceeding the maximum threshold volume and has volume valleys falling below the minimum threshold volume;

In a next logical step 48, it is determined by the ECD (based on determination in step 46) whether volume peaks exceeding the maximum threshold volume are present in the buffered audio signal. If it is determined that the volume peaks exceeding the maximum threshold volume are present, the process goes to step 50.

In a next logical step 50, it is determined by the ECD (based on determination in step 46) whether volume valleys falling below the minimum threshold volume are present in the buffered audio signal. If it is determined that the volume valleys falling below the minimum threshold volume are present, the process goes to step 52. In step 52, the ECD calculates and performs volume adjustment for the buffered audio signal like in FIGS. 4a-4c or in FIGS. 5a-5c. Then the process goes to step 60.

Coming back to logical step 48, if it is determined by the ECD (based on determination in step 46) that the peaks exceeding the maximum threshold volume are not present in the buffered audio signal, the process goes to step 54.

In a next logical step 54, it is determined by the ECD (based on determination in step 46) whether volume valleys falling below the minimum threshold volume are present in the buffered audio signal. If it is determined that the volume valleys falling below the minimum threshold volume are present, the process goes to step 58. In step 58, the ECD calculates and performs volume adjustment for the buffered audio signal like in FIGS. 3a-3b. Then the process goes to step 60.

If, however, it is determined in step 54 that the volume valleys falling below the minimum threshold volume are present, the process goes to step 56. In step 56, the ECD calculates and performs volume adjustment for the buffered audio signal like in FIGS. 2a-2b. Then the process goes to step 60.

Finally, in a next step 60 the ECD provides the buffered audio signal modified according to the calculated volume adjustment to a play-out device (TV) for playing out the audio stream.

FIG. 7 depicts a high-level block diagram of a computing device 700 suitable for use in performing various functions described herein with respect to the disclosed embodiments, such as those associated with device 12 as described above with respect to FIG. 1. FIG. 7 is a simplified block diagram of a computing/electronic device that is suitable for practicing the exemplary embodiments of this invention, and a specific manner in which components of the device are configured to cause that device to operate.

As depicted in FIG. 7, computer (computing device) 700 includes a processor element 703 (e.g., a central processing unit (CPU) and/or other suitable processor(s)), a memory 704 (e.g., random access memory (RAM), read only memory (ROM), and the like), a cooperating module/process 705, and various input/output devices 706 (e.g., a user input device (such as a keyboard, a keypad, a mouse, and the like), a user output device (such as a display, a speaker, and the like), an input port, an output port, a receiver, a transmitter, and storage devices (e.g., a tape drive, a floppy drive, a hard disk drive, a compact disk drive, and the like).

It will be appreciated that the functions depicted and described herein may be implemented in hardware and/or in a combination of software and hardware, e.g., using a general purpose computer, one or more application specific integrated circuits (ASIC), and/or any other hardware equivalents. In one embodiment, the cooperating process 705 can be loaded into memory 704 and executed by processor 702 to implement the functions as discussed herein. Thus, cooperating process 705 (including associated data structures) can be stored on a computer readable storage medium, e.g., RAM memory, magnetic or optical drive or diskette, and the like.

It will be appreciated that computing device 700 depicted in FIG. 7 provides a general architecture and functionality suitable for implementing functional elements described herein or portions of the functional elements described herein.

It is contemplated that some of the steps discussed herein may be implemented within hardware, for example, as circuitry that cooperates with the processor to perform various method steps. Portions of the functions/elements described herein may be implemented as a computer program product wherein computer instructions, when processed by a computing device, adapt the operation of the computing device such that the methods and/or techniques described herein are invoked or otherwise provided. Instructions for invoking the inventive methods may be stored in tangible and non-transitory computer readable medium such as fixed or removable media or memory, and/or stored within a memory within a computing device operating according to the instructions.

Various modifications may be made to the systems, methods, apparatus, mechanisms, techniques and portions thereof described herein with respect to the various figures, such modifications being contemplated as being within the scope of the invention. For example, while a specific order of steps or arrangement of functional elements is presented in the various embodiments described herein, various other orders/arrangements of steps or functional elements may be utilized within the context of the various embodiments. Further, while modifications to embodiments may be discussed individually, various embodiments may use multiple modifications contemporaneously or in sequence, compound modifications and the like.

The various embodiments contemplate an apparatus configured to provide functions in accordance with the various embodiments, the apparatus comprising a processor and a memory communicatively connected to the processor, the processor configured to perform these functions as described above with respect to the various figures.

In describing alternate embodiments of the apparatus claimed, specific terminology is employed for the sake of clarity. The invention, however, is not intended to be limited to the specific terminology so selected. Thus, it is to be understood that each specific element includes all technical equivalents that operate in a similar manner to accomplish similar functions.

It is to be understood that the foregoing description is intended to illustrate and not to limit the scope of the invention, which is defined by the scope of the appended claims. Other embodiments are within the scope of the following claims.

It is noted that various non-limiting embodiments described herein may be used separately, combined or selectively combined for specific applications.

Further, some of the various features of the above non-limiting embodiments may be used to advantage without the corresponding use of other described features. The foregoing description should therefore be considered as merely illustrative of the principles, teachings and exemplary embodiments of this invention, and not in limitation thereof.

Although various embodiments which incorporate the teachings of the present invention have been shown and described in detail herein, those skilled in the art can readily devise many other varied embodiments that still incorporate these teachings. Thus, while the foregoing is directed to various embodiments of the present invention, other and further embodiments of the invention may be devised without departing from the basic scope thereof. As such, the appropriate scope of the invention is to be determined according to the claims.

What is claimed is:

1. A method, performed by an electronic device, the method comprising:
setting minimum and maximum threshold volumes defining respective minimum and maximum acceptable volumes for audio signals;
buffering an audio signal for a predefined time interval from an audio stream;
determining whether the buffered audio signal has volume peaks exceeding the maximum threshold volume and has volume valleys falling below the minimum threshold volume;
calculating a volume adjustment for the buffered audio signal using a predefined algorithm for modifying a volume corresponding to the buffered audio signal, so that by applying the calculated volume adjustment, the volume corresponding to the buffered audio signal including determined volume peaks exceeding the maximum threshold volume being attenuated to a level below the maximum threshold volume during the predefined time interval, and the volume corresponding to the buffered audio signal including determined volume valleys below the minimum threshold volume level being amplified to a level above the minimum threshold volume during the predefined time interval; and
providing the buffered audio signal modified according to the calculated volume adjustment to a play-out device for playing out the audio stream;
wherein said electronic device is configured to process said audio signal to provide a corresponding sequence of buffered audio signals modified according to respective calculated volume adjustments;
wherein said volume adjustment comprises attenuating the determined volume peaks exceeding the maximum threshold volume to fall below the maximum threshold volume when no volume valleys being determined, and the calculating comprises:
calculating a downscale volume coefficient as a ratio of a volume distance between the maximum and minimum threshold volumes and a further volume distance between the largest volume peak among the determined volume peaks and the minimum threshold volume; and
multiplying the volume corresponding to the buffered audio signal with respect to the minimum threshold volume in the predefined time interval by the calculated downscale volume coefficient to bring the determined volume peaks below the maximum threshold volume.

2. The method of claim 1, wherein said minimum and maximum threshold volumes are set based on a user input through a user interface of the electronic device or the play-out device.

3. The method of claim 1, wherein the maximum threshold volume is set based on a user input through a user interface of the electronic device or the play-out device, and wherein the minimum threshold volume is a system parameter.

4. The method of claim 1, wherein the play-out device is a television set.

5. The method of claim 1, wherein said electronic device is a set-top box (STB).

6. The method of claim 1, wherein the predefined time duration is between one and three seconds.

7. The method of claim 1, wherein the audio stream is a part of a video stream and the adjusted audio stream is synchronized with a corresponding video signal in the electronic device or in a play-out device.

8. The method of claim 1, wherein the electronic device comprises said play-out device.

9. The method of claim 1, wherein said volume adjustment comprises amplifying the determined volume valleys falling below the minimum threshold volume to rise above the minimum threshold volume, and the calculating comprises:
further calculating an up-scale volume coefficient as a ratio of a volume distance between the maximum and minimum threshold volumes and a further volume distance between the largest volume valley and the maximum threshold volume; and
multiplying a volume corresponding to the downscaled buffered audio signal with respect to the maximum threshold volume in the predefined time interval by the up-scale volume coefficient to bring the resultant volume valleys above the minimum threshold volume.

10. A method, performed by an electronic device, the method comprising:
setting minimum and maximum threshold volumes defining respective minimum and maximum acceptable volumes for audio signals;
buffering an audio signal for a predefined time interval from an audio stream;
determining whether the buffered audio signal has volume peaks exceeding the maximum threshold volume and has volume valleys falling below the minimum threshold volume;
calculating a volume adjustment for the buffered audio signal using a predefined algorithm for modifying a volume corresponding to the buffered audio signal, so that by applying the calculated volume adjustment, the volume corresponding to the buffered audio signal including determined volume peaks exceeding the maximum threshold volume being attenuated to a level below the maximum threshold volume during the predefined time interval, and the volume corresponding to the buffered audio signal including determined volume valleys below the minimum threshold volume level being amplified to a level above the minimum threshold volume during the predefined time interval; and
providing the buffered audio signal modified according to the calculated volume adjustment to a play-out device for playing out the audio stream;
wherein said electronic device is configured to process said audio signal to provide a corresponding sequence of buffered audio signals modified according to respective calculated volume adjustments;
wherein said volume adjustment comprises amplifying the determined volume valleys falling below the minimum threshold volume to rise above the minimum threshold volume when no volume peaks being determined, and the calculating comprises:
calculating an up-scale volume coefficient as a ratio of a volume distance between the maximum and minimum threshold volumes and a further volume distance between the largest volume valley and the maximum threshold volume; and
multiplying the volume corresponding to the buffered audio signal with respect to the maximum threshold volume in the predefined time interval by the calculated up-scale volume coefficient to bring the determined volume valleys above the minimum threshold volume.

11. A method, performed by an electronic device, the method comprising:
setting minimum and maximum threshold volumes defining respective minimum and maximum acceptable volumes for audio signals;
buffering an audio signal for a predefined time interval from an audio stream;
determining whether the buffered audio signal has volume peaks exceeding the maximum threshold volume and has volume valleys falling below the minimum threshold volume;
calculating a volume adjustment for the buffered audio signal using a predefined algorithm for modifying a volume corresponding to the buffered audio signal, so that by applying the calculated volume adjustment, the volume corresponding to the buffered audio signal including determined volume peaks exceeding the maximum threshold volume being attenuated to a level below the maximum threshold volume during the predefined time interval, and the volume corresponding to the buffered audio signal including determined volume valleys below the minimum threshold volume level being amplified to a level above the minimum threshold volume during the predefined time interval; and
providing the buffered audio signal modified according to the calculated volume adjustment to a play-out device for playing out the audio stream;
wherein said electronic device is configured to process said audio signal to provide a corresponding sequence of buffered audio signals modified according to respective calculated volume adjustments;
wherein said volume adjustment comprises amplifying the determined volume valleys falling below the minimum threshold volume to rise above the minimum threshold volume, and attenuating the determined volume peaks exceeding the maximum threshold volume to fall below the maximum threshold volume, and the calculating comprises:
calculating an up-scale volume coefficient as a ratio of a volume distance between the minimum threshold volume and a largest volume peak among the determined volume peaks, and a further volume distance between a largest volume valley among the determined volume valleys and the largest volume peak;
multiplying the volume corresponding to the buffered audio signal with respect to the maximum volume peak in the predefined time interval by the calculated up-scale volume coefficient to bring the determined volume valleys above the minimum threshold volume;
further calculating a downscale volume coefficient as a ratio of a volume distance between the maximum and minimum threshold volumes and a further volume distance between the largest volume peak among resultant volume peaks and the minimum threshold volume; and
multiplying a volume corresponding to the up-scaled buffered audio signal with respect to the minimum threshold volume in the predefined time interval by the downscale volume coefficient to bring the resultant volume peaks below the maximum threshold volume.

12. An apparatus comprising:
a processor;
a storage medium for tangibly storing thereon program logic for execution by the processor, the program logic comprising:
logic to set minimum and maximum threshold volumes defining respective minimum and maximum acceptable volumes for audio signals;
logic to buffer an audio signal for a predefined time interval from an audio stream;
logic to determine whether the buffered audio signal has volume peaks exceeding the maximum threshold volume and has volume valleys falling below the minimum threshold volume;
logic to calculate a volume adjustment for the buffered audio signal using a predefined algorithm for modifying a volume corresponding to the buffered audio signal, so that by applying the calculated volume adjustment, the volume corresponding to the buffered audio signal including determined volume peaks exceeding the maximum threshold volume being attenuated to a level below the maximum threshold volume during the predefined time interval, and the volume corresponding to the buffered audio signal including determined volume valleys below the minimum threshold volume level being amplified to a level above the minimum threshold volume during the predefined time interval; and
logic to provide the buffered audio signal modified according to the calculated volume adjustment to a play-out device for playing out the audio stream;
wherein said program logic is configured to process said audio signal to provide a corresponding sequence of buffered audio signals modified according to respective calculated volume adjustments;
wherein said volume adjustment comprises amplifying the determined volume valleys falling below the minimum threshold volume to rise above the minimum threshold volume, and attenuating the determined volume peaks exceeding the maximum threshold volume to fall below the maximum threshold volume, and the calculating comprises:
calculating an up-scale volume coefficient as a ratio of a volume distance between the minimum threshold volume and a largest volume peak among the determined volume peaks, and a further volume distance between a largest volume valley among the determined volume valleys and the largest volume peak;
multiplying the volume corresponding to the buffered audio signal with respect to the maximum volume peak in the predefined time interval by the calculated up-scale volume coefficient to bring the determined volume valleys above the minimum threshold volume;
further calculating a downscale volume coefficient as a ratio of a volume distance between the maximum and minimum threshold volumes and a further volume distance between the largest volume peak among resultant volume peaks and the minimum threshold volume; and
multiplying a volume corresponding to the up-scaled buffered audio signal with respect to the minimum threshold volume in the predefined time interval by the downscale volume coefficient to bring the resultant volume peaks below the maximum threshold volume.

13. The apparatus of claim 12, wherein said minimum and maximum threshold volumes are set based on a user input through a user interface of the electronic device or the play-out device.

14. The apparatus of claim 12, wherein the maximum threshold volume is set based on a user input through a user interface of the electronic device or the play-out device, and wherein the minimum threshold volume is a system parameter.

15. The apparatus of claim 12, wherein the predefined time duration is between one and three seconds.

16. A non-transitory computer readable storage medium tangibly storing computer program instructions capable of being executed by a computer processor, the computer program instructions defining code for:

setting minimum and maximum threshold volumes defining respective minimum and maximum acceptable volumes for audio signals;

buffering an audio signal for a predefined time interval from an audio stream;

determining whether the buffered audio signal has volume peaks exceeding the maximum threshold volume and has volume valleys falling below the minimum threshold volume;

calculating a volume adjustment for the buffered audio signal using a predefined algorithm for modifying a volume corresponding to the buffered audio signal, so that by applying the calculated volume adjustment, the volume corresponding to the buffered audio signal including determined volume peaks exceeding the maximum threshold volume being attenuated to a level below the maximum threshold volume during the predefined time interval, and the volume corresponding to the buffered audio signal including determined volume valleys below the minimum threshold volume level being amplified to a level above the minimum threshold volume during the predefined time interval; and providing the buffered audio signal modified according to the calculated volume adjustment to a play-out device for playing out the audio stream;

wherein said computer program instructions defining code configured to process said audio signal to provide a corresponding sequence of buffered audio signals modified according to respective calculated volume adjustments;

wherein said volume adjustment comprises attenuating the determined volume peaks exceeding the maximum threshold volume to fall below the maximum threshold volume when no volume valleys being determined, and the calculating comprises:

calculating a downscale volume coefficient as a ratio of a volume distance between the maximum and minimum threshold volumes and a further volume distance between the largest volume peak among the determined volume peaks and the minimum threshold volume; and multiplying the volume corresponding to the buffered audio signal with respect to the minimum threshold volume in the predefined time interval by the calculated downscale volume coefficient to bring the determined volume peaks below the maximum threshold volume.

17. The non-transitory computer readable storage medium of claim 16, wherein said minimum and maximum threshold volumes are set based on a user input through a user interface of the electronic device or the play-out device.

18. The non-transitory computer readable storage medium of claim 16, wherein the maximum threshold volume is set based on a user input through a user interface of the electronic device or the play-out device, and wherein the minimum threshold volume is a system parameter.

19. The non-transitory computer readable storage medium of claim 16, wherein the predefined time duration is between one and three seconds.

20. The non-transitory computer readable storage medium of claim 16, wherein said volume adjustment comprises amplifying the determined volume valleys falling below the minimum threshold volume to rise above the minimum threshold volume, and the calculating comprises:

calculating an up-scale volume coefficient as a ratio of a volume distance between the maximum and minimum threshold volumes and a further volume distance between the largest volume valley and the maximum threshold volume; and multiplying a volume corresponding to the downscaled buffered audio signal with respect to the maximum threshold volume in the predefined time interval by the up-scale volume coefficient to bring the resultant volume valleys above the minimum threshold volume.

* * * * *